(12) United States Patent
Kwak et al.

(10) Patent No.: US 9,287,367 B2
(45) Date of Patent: Mar. 15, 2016

(54) SEMICONDUCTOR DEVICE AND METHOD OF MANUFACTURING THE SAME

(71) Applicant: Seoul Viosys Co., Ltd., Ansan-si (KR)

(72) Inventors: Woo Chul Kwak, Ansan-si (KR); Seung Kyu Choi, Ansan-si (KR); Chae Hon Kim, Ansan-si (KR); Jung Whan Jung, Ansan-si (KR); Yong Hyun Baek, Ansan-si (KR); Sam Seok Jang, Ansan-si (KR); Su Youn Hong, Ansan-si (KR); Mi Gyeong Jeong, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/526,427

(22) Filed: Oct. 28, 2014

(65) Prior Publication Data

US 2015/0115223 A1    Apr. 30, 2015

(30) Foreign Application Priority Data

| | | |
|---|---|---|
| Oct. 28, 2013 | (KR) | 10-2013-0128589 |
| Apr. 17, 2014 | (KR) | 10-2014-0045933 |
| Aug. 14, 2014 | (KR) | 10-2014-0106024 |
| Aug. 14, 2014 | (KR) | 10-2014-0106025 |
| Aug. 14, 2014 | (KR) | 10-2014-0106026 |

(51) Int. Cl.

| | |
|---|---|
| *H01L 29/06* | (2006.01) |
| *H01L 29/20* | (2006.01) |
| *H01L 29/15* | (2006.01) |
| *H01L 29/201* | (2006.01) |
| *H01L 29/205* | (2006.01) |
| *H01L 33/04* | (2010.01) |
| *H01L 33/02* | (2010.01) |
| *H01L 33/22* | (2010.01) |

(52) U.S. Cl.
CPC .......... *H01L 29/2003* (2013.01); *H01L 29/155* (2013.01); *H01L 29/201* (2013.01); *H01L 29/205* (2013.01); *H01L 33/02* (2013.01); *H01L 33/025* (2013.01); *H01L 33/04* (2013.01); *H01L 33/22* (2013.01)

(58) Field of Classification Search
CPC .................. H01L 2924/00; H01L 2924/0002; H01L 33/007; H01L 33/32; H01L 21/02458; H01L 21/0254; H01L 21/0262; H01L 33/025; H01L 33/22; H01L 33/06; H01L 33/325; H01L 21/02494; H01L 21/02579
USPC .......... 438/22, 27–28, 46; 257/13, 88, 94, 97, 257/660, E21.599, E33.006
See application file for complete search history.

(56) References Cited

U.S. PATENT DOCUMENTS

| | | | |
|---|---|---|---|
| 6,329,667 B1 * | 12/2001 | Ota et al. | 257/13 |
| 2014/0106493 A1 * | 4/2014 | Ting | 438/46 |

*Primary Examiner* — Kimberly Rizkallah
*Assistant Examiner* — Maria Ligai
(74) *Attorney, Agent, or Firm* — Perkins Coie LLP

(57) ABSTRACT

Disclosed are semiconductor devices and methods of manufacturing the same. The semiconductor device includes: a first conductive type semiconductor layer including a first lower conductive type semiconductor layer and a first upper conductive type semiconductor layer; a V-pit passing through at least one portion of the first upper conductive type semiconductor layer; a second conductive type semiconductor layer placed over the first conductive type semiconductor and filling the V-pit; and an active layer interposed between the first and second conductive type semiconductor layers with the V-pit passing through the active layer. The first upper conductive type semiconductor layer has a higher defect density than the first lower conductive type semiconductor layer and includes a V-pit generation layer comprising a starting point of the V-pit. The semiconductor device includes the V-pits having a large size and a high density to efficiently preventing damage to the semiconductor device due to electrostatic discharge.

16 Claims, 12 Drawing Sheets

Fig. 14

|  | p-type nitride semiconductor layer 3~5nm | p-type nitride semiconductor layer 3~5nm | p-type nitride semiconductor layer 3~5nm |
|---|---|---|---|
| TMGa | | | |
| TMAl | undoped layer 30~40nm | undoped layer 30~40nm | undoped layer 30~40nm |
| Cp2Mg | | | |

# SEMICONDUCTOR DEVICE AND METHOD OF MANUFACTURING THE SAME

CROSS-REFERENCE TO RELATED APPLICATION

This patent document claims priority from and the benefit of Korean Patent Application No. 10-2013-0128589 filed on Oct. 28, 2013, Korean Patent Application No. 10-2014-0045933 filed on Apr. 17, 2014, Korean Patent Application No. 10-2014-0106024 filed on Aug. 14, 2014, Korean Patent Application No. 10-2014-0106025 filed on Aug. 14, 2014, and Korean Patent Application No. 10-2014-0106026 filed on Aug. 14, 2014, the contents of which are hereby incorporated by reference in their entirety.

TECHNICAL FIELD

This patent document relates to a semiconductor device and a method of manufacturing the same including a semiconductor device and a method of manufacturing the same which can improve electrostatic discharge characteristics.

BACKGROUND

Nitride semiconductors are used as light sources of various devices including display devices, signal lamps, lighting devices and optical communication devices. Nitride semiconductors can be used in blue or green light emitting diodes and laser diodes. In addition, nitride semiconductors can also be used in heterojunction bipolar transistors (HBTs), high electron mobility transistors (HEMTs), and the like.

Nitride semiconductors can be grown on a substrate including a sapphire substrate, a silicon carbide substrate or a silicon substrate, in which lattice mismatch occurs. Obtaining lattice-matched substrates tend to be difficult, and the nitride semiconductors grown on a lattice-mismatched substrate have a considerably high threading dislocation density (TDD) of about $1E9/cm^2$ or more.

Threading dislocation induces non-radiative recombination by providing an electron trap site or provides a current leakage path. When overvoltage such as static electricity is applied to a semiconductor device in such a state, currents are concentrated through the threading dislocations and causes damage to the semiconductor device due to electrostatic discharge (ESD). Thus, the semiconductor device has poor electrostatic characteristics.

Several methods have been proposed to complement poor electrostatic characteristics of nitride semiconductor devices. For example, Zener diodes can be used together with nitride semiconductor devices. The nitride semiconductor devices are protected by connecting the Zener diodes to the nitride semiconductor devices in parallel and diverting unexpected electrostatic discharge to the Zener diodes. However, costs and process time are increased on account of high price and additional processes for Zener diodes.

In another example, a substrate, such as a GaN substrate, lattice-matched with nitride semiconductors can be implemented. However, since the manufacturing costs for the GaN substrate are considerably high, it is difficult to generally apply the GaN substrate to all devices. In fact, the GaN substrate is used for specific devices only such as lasers.

Another possibility is to fill V-pits by growing nitride semiconductor layers having the V-pits in an active layer while adjusting a growth temperature, and growing a p-type semiconductor layer at a high temperature in order to enhance electrostatic discharge characteristics of a nitride semiconductor device. This approach is discussed in KR Patent No. 10-1026031. In this approach, the V-pits formed in the active layer form an electric potential barrier against the injection of carriers, thereby enhancing electrostatic discharge characteristics. However, current leakage can increase according to doping conditions due to a narrow margin for the growth process of the p-type semiconductor layer for filling the V-pits.

SUMMARY

Embodiments of the disclosed technology provide a semiconductor device having improved electrostatic discharge characteristics and a method of manufacturing the same.

In accordance with one aspect of the disclosed technology, a semiconductor device is provided to include: a first conductive type semiconductor layer including a first lower conductive type semiconductor layer and a first upper conductive type semiconductor layer; V-pits passing through at least one portion of the first upper conductive type semiconductor layer; a second conductive type semiconductor layer placed over the first conductive type semiconductor and filling the V-pits; and an active layer interposed between the first and second conductive type semiconductor layers, the V-pits passing through the active layer, wherein the first upper conductive type semiconductor layer has a higher defect density than the first lower conductive type semiconductor layer and includes a V-pit generation layer including starting points of the V-pits.

In some implementations, the first upper conductive type semiconductor layer can further include a superlattice layer placed over the V-pit generation layer. In some implementations, a width of the V-pits can be increased due to compressive strain caused by a lattice constant of the superlattice layer being larger than that of a low-temperature growth layer. In some implementations, the V-pit generation layer and the superlattice layer can include indium (In) and an In content of the V-pit generation layer can be lower than that of the superlattice layer. In some implementations, the first upper conductive type semiconductor layer can further include a low-temperature growth doping layer interposed between the V-pit generation layer and the superlattice layer.

In some implementations, an upper width of the V-pits can be proportional to a thickness of the V-pit generation layer. In some implementations, the V-pit generation layer can include an undoped GaN layer.

In some implementations, the V-pit generation layer can include indium (In). In some implementations, the V-pit generation layer can include an AlInGaN based nitride semiconductor layer and an AlGaN based nitride semiconductor layer that are alternately stacked.

In some implementations, the semiconductor device can further include: a low-concentration doping layer interposed between the V-pit generation layer and the active layer; and a high-concentration barrier layer interposed between the low-concentration doping layer and the active layer and doped with Si. In some implementations, a doping concentration of the low-concentration doping layer can be lower than those of the high-concentration barrier layer and the first lower conductive type semiconductor layer to form a capacitor.

In some implementations, the semiconductor device can further include a low-concentration superlattice layer interposed between the low-concentration doping layer and the high-concentration barrier layer. In some implementations, a doping concentration of the low-concentration superlattice layer can be equal to or lower than that of the low-concentration doping layer. In some implementations, the V-pits can cross the high-concentration barrier layer such that the high-concentration barrier layer has a three-dimensional shape.

In some implementations, the semiconductor device can further include a high-resistance filling layer interposed between the active layer and the second conductive type semiconductor layer and filling the V-pits. In some implementations, the high-resistance filling layer includes an undoped layer and a doping layer that are alternately stacked such that holes are injected into the active layer through inner inclined surfaces of the V-pits.

In some implementations, the undoped layer includes a uAlGaN layer and the doping layer includes a p-type nitride semiconductor layer. In some implementations, the undoped layer includes a uGaN layer and the doping layer includes a p-type nitride semiconductor layer. In some implementations, the undoped layer and the doping layer can be alternately repetitively stacked three times.

In some implementations, the semiconductor device can further include an electron blocking layer interposed between the active layer and the high-resistance filling layer and filling at least one portion of the V-pits, wherein the high-resistance filling layer can fill the rest of the V-pits.

As described above, according to the disclosed technology, a semiconductor device can include V-pits having a large size and a high density, which can efficiently prevent damage to the semiconductor device caused by electrostatic discharge. In addition, damage to the semiconductor device due to electrostatic discharge can be prevented without using Zener diodes, thereby achieving compactness and high efficiency of the semiconductor device. Further, it is possible to manufacture a semiconductor device free from electrostatic discharge by effectively forming V-pits.

The size of the V-pits can be increased by employing a low-temperature growth layer, and electrons can be more efficiently injected into an active layer through a high-concentration barrier layer. Thus, electrostatic discharge characteristics can be improved without deteriorating luminous intensity or electric properties of a nitride semiconductor device.

The V-pits are filled with a high-resistance filling layer instead of a p-type nitride semiconductor layer. Thus, it is possible to increase in current leakage depending upon Mg doping conditions. In addition, by filling the V-pits with the high-resistance filling layer, threading dislocation does not form a leakage current path. Thus, damage to a nitride semiconductor device caused by external high voltage is prevented.

In some implementations, a high-concentration barrier layer doped with high-concentration Si is placed over a starting location of an active layer and a low-concentration doping layer is interposed between an n-type nitride semiconductor layer and the high-concentration barrier layer. Thus, internal capacitance of a nitride semiconductor device is increased, which can improve electrostatic discharge characteristics. In this case, the internal capacitance is proportional to the size of an area of the high-concentration barrier layer. Therefore, as the area of the high-concentration barrier layer having a three-dimensional shape is increased by areas of the V-pits, the internal capacitance is increased. Thus, electrostatic discharge characteristics can be effectively improved.

In some implementations, the V-pits formed in the nitride semiconductor device are filled with a high-resistance filling layer, thereby preventing the V-pits from forming a current leakage path.

A high-resistance filling layer is grown by changing a p-type nitride semiconductor layer to an AlGaN layer. Thus, it is possible to grow a nitride semiconductor device having stronger tolerance than previously possible without changing the p-type nitride. In addition, holes are injected into each well layer in an active layer through inner inclined surfaces of the V-pits by periodically growing a uAlGaN layer and a p-type nitride semiconductor layer, and a uGaN layer and a p-type nitride semiconductor layer, thereby enhancing hole injection efficiency. Further, the V-pits formed over the entire active layer allows holes to be effectively injected into a well layer close to an n-type nitride semiconductor layer.

BRIEF DESCRIPTION OF DRAWINGS

The above and other aspects, features, and advantages of the disclosed technology in this patent document will become apparent from the detailed description of the following embodiments in conjunction with the accompanying drawings, in which:

FIG. 14 is a sequence chart showing a process of forming a high-resistance filling layer within V-pits of the semiconductor device of FIG. 13;

DETAILED DESCRIPTION OF THE EXEMPLARY EMBODIMENTS

Exemplary embodiments of the disclosed technology will be more specifically described with reference to the accompanying drawings.

Figure 1:
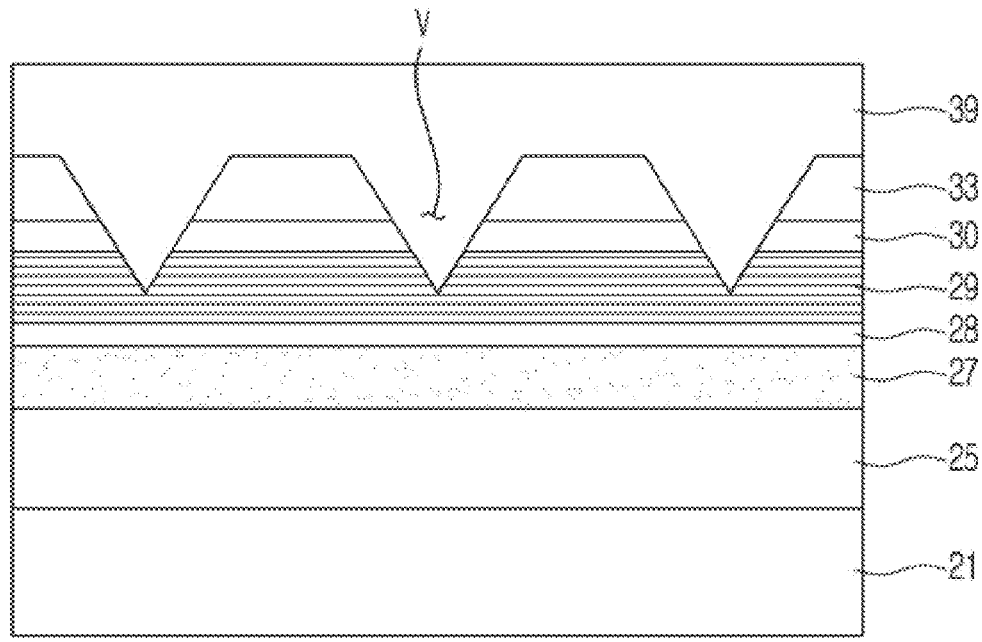
FIG. 1 is a sectional view of an exemplary semiconductor device according to a first embodiment of the disclosed technology.

FIG. 1 is a sectional view of an exemplary nitride semiconductor device according to a first embodiment of the disclosed technology.

Referring to FIG. 1, a nitride semiconductor device includes a first conductive type semiconductor layer, a second conductive type nitride semiconductor layer, a substrate 21, and an active layer 33 with V-pits V formed in the active layer.

The substrate 21 can be or include a substrate capable of growing the first and second conductive type semiconductor layers. The substrate 21 can include, for example, a sapphire substrate, a silicon carbide substrate, a silicon substrate, a nitride substrate, or the like. The substrate 21 can have a polar, non-polar, or semi-polar growth plane. Although the substrate 21 is described as a sapphire substrate having a c-plane as a growth plane (a polar growth plane) in this embodiment, other implementations are also possible.

The nitride semiconductor device can further include a buffer layer (not shown) interposed between the first conductive type semiconductor layer and the substrate 21. The buffer layer can function as a seed layer allowing the first conductive type semiconductor layer to be grown.

The first conductive type semiconductor layer can be placed on or above the substrate 21. The first conductive type semiconductor layer can include an n-type nitride semiconductor layer 25 that is a first lower conductive type semiconductor layer. A first upper conductive type semiconductor layer which is described below can be placed on or above the n-type nitride semiconductor layer 25. A low-temperature growth layer 27, a low-temperature growth doping layer 28, a super-lattice layer 29, and a low-concentration doping layer 30 can be formed on or over the n-type nitride semiconductor layer 25. In this case, the low-temperature growth layer 27, the low-temperature growth doping layer 28, the super-lattice layer 29, and the low-concentration doping layer 30 are referred to as the first upper conductive type semiconductor layer. The first upper conductive type semiconductor layer including the low-temperature growth layer 27, the low-temperature growth doping layer 28, the super-lattice layer 29, and the low-concentration doping layer 30 can have a higher defect density than the n-type nitride semiconductor layer 25. To this end, the n-type nitride semiconductor layer 25 and the upper first conductive type semiconductor layer can be grown under different temperature conditions.

For example, the n-type nitride semiconductor layer 25 can be grown at a high temperature of 1000° C. or more and the first upper conductive type semiconductor layer can be grown at a low temperature of 800° C. to 900° C. By doing so, the first upper conductive type semiconductor layer can have a higher defect density than the n-type nitride semiconductor layer 25. When the first upper conductive type semiconductor layer is formed to have a higher defect density, the V-pits V can be formed to pass through at least a part of the first upper conductive type semiconductor layer.

The n-type nitride semiconductor layer 25 can include a nitride semiconductor such as (Al, Ga, or In)N and is doped with an impurity such as Si to form an n-type layer. For example, the n-type nitride semiconductor layer 25 can include n-type GaN. The n-type nitride semiconductor layer 25 can be formed of a single or multiple layers.

The first upper conductive type semiconductor layer can include a nitride semiconductor such as (Al, Ga, or In)N, and can be doped with an impurity such as Si to form an n-type layer or can include an undoped nitride semiconductor. In one implementation, the first upper conductive type semiconductor layer can include multiple layers.

As described above, the first upper conductive type semiconductor layer can include the low-temperature growth layer 27, and can also further include the super-lattice layer 29 on the low-temperature growth layer 27. In one implementation, the first upper conductive type semiconductor layer can further include the low-temperature growth doping layer 28 interposed between the low-temperature growth layer 27 and the super-lattice layer 29. In one implementation, the first upper conductive type semiconductor layer can further include the low-temperature growth doping layer 28 interposed between the low-temperature growth layer 27 and the low-concentration doping layer 30 placed on or above the super-lattice layer 29.

The low-temperature growth layer 27 may operate as a V-pit generation layer for generating the V-pits V. The low-temperature growth layer 27 can be grown at a lower temperature (e.g., 800° C. to 900° C.) and can include an undoped GaN layer. Therefore, the low-temperature growth layer 27 can have a higher defect density and act as starting points where the V-pits are generated. In one implementation, the low-temperature growth layer 27 can allow the V-pits V to be generated by inducing three-dimensional growth under the control of growth conditions. The characteristics of the V-pits V including the size and density of the V-pits V can be adjusted depending upon the characteristics of the low-temperature growth layer 27.

For example, an upper width of the V-pits V can be proportional to a thickness of the low-temperature growth layer 27, and the density of the V-pits V can be determined depending upon a defect density based at least partly on a growth condition of the low-temperature growth layer 27. As described above in the first embodiment of the disclosed technology, the nitride semiconductor device includes the first upper conductive type semiconductor layer including the low-temperature growth layer 27 to allow formation of the V-pits V with a larger size and a higher density than previously possible without the described structure of the first upper conductive type semiconductor layer, which can effectively prevent damage to the nitride semiconductor device caused by electrostatic discharge (ESD).

The super-lattice layer 29 can be placed on or above the low-temperature growth layer 27 and grown in the temperature range similar to the growth temperature of the low-temperature growth layer 27. The super-lattice layer 29 can include a structure in which at least two of a GaN layer, an InGaN layer, an AlGaN layer, or an AlInGaN layer are stacked or repetitively stacked. The first upper conductive type semiconductor layer includes the super-lattice layer 29 to effectively compensate for increase in defect density and decrease in crystallinity due to the lower growth temperature. Thus, it is possible to prevent decrease in crystallinity of the active layer 33 grown on the conductive type semiconductor layer.

The low-temperature growth doping layer 28 can be interposed between the low-temperature growth layer 27 and the super-lattice layer 29, and the low-concentration doping layer 30 can be placed on or over the super-lattice layer 29. The low-temperature growth doping layer 28 and the low-concentration doping layer 30 can be doped with an n-type impurity and can include, for example, an n-type GaN layer.

The active layer 33 can be placed on or over the first upper conductive type semiconductor layer and can have a single-quantum well structure or a multi-quantum well structure in which a barrier layer and a quantum well layer are alternately stacked. The barrier layer can be formed of or include a gallium nitride semiconductor layer, for example GaN, InGaN, AlGaN, or AlInGaN, having a wider band gap than the quantum well layer. A desired wavelength of light can be emitted from the active layer 33. The desired wavelength of the light can be achieved by adjusting properties of the gallium nitride semiconductor including, for example, a composition ratio of the gallium nitride semiconductor in the quantum well layer. Although the barrier layer and the quantum well layer of the active layer 33 can be formed of or include an undoped layer, which is not doped with impurities, so as to enhance crystal quality of an active region, any portion including the entirety of the active region can be doped with impurities so as to reduce forward voltage.

The V-pits V can pass through at least one part of the first upper conductive type semiconductor layer and the active layer 33. The plurality of V-pits V, having a V-shaped cross section with a gradually increasing width from a lower portion to an upper portion of the V-Pits V, can be formed to be adjacent or spaced apart from one another. As described above, the upper width of the V-pits V can be determined in proportion to the thickness of the low-temperature growth layer 27 and can be, for example, 60 nm to 220 nm. As such, according to the first embodiment of the disclosed technology, the V-pits V can have an upper width greater than previously possible without the structures of the semiconductor device implemented according the disclosed technology, which can effectively block backward current caused by electrostatic discharge.

The second conductive type semiconductor layer can be placed on or over the active layer 33 and can fill the V-pits V. An upper surface of the second conductive type semiconductor layer filling up the V-pits V can be flattened.

The second conductive type semiconductor layer can include a nitride semiconductor such as (Al, Ga, or In)N. In one implementation, the second conductive type semiconductor can be or include a p-type nitride semiconductor layer 39 doped with an impurity such as Mg to form a p-type layer. In one implementation, the second conductive type semiconductor layer can include multiple layers, for example, a clad layer and a contact layer.

According to the first embodiment of the disclosed technology, the nitride semiconductor layer has the V-pits V having a larger size and a higher density, that can effectively prevent damage to the device which is caused by electrostatic discharge. The nitride semiconductor device suggested according to the first embodiment of the disclosed technology can be applied to various types of semiconductor devices including light emitting diodes, laser diodes, transistors, and the like.

Figure 2:
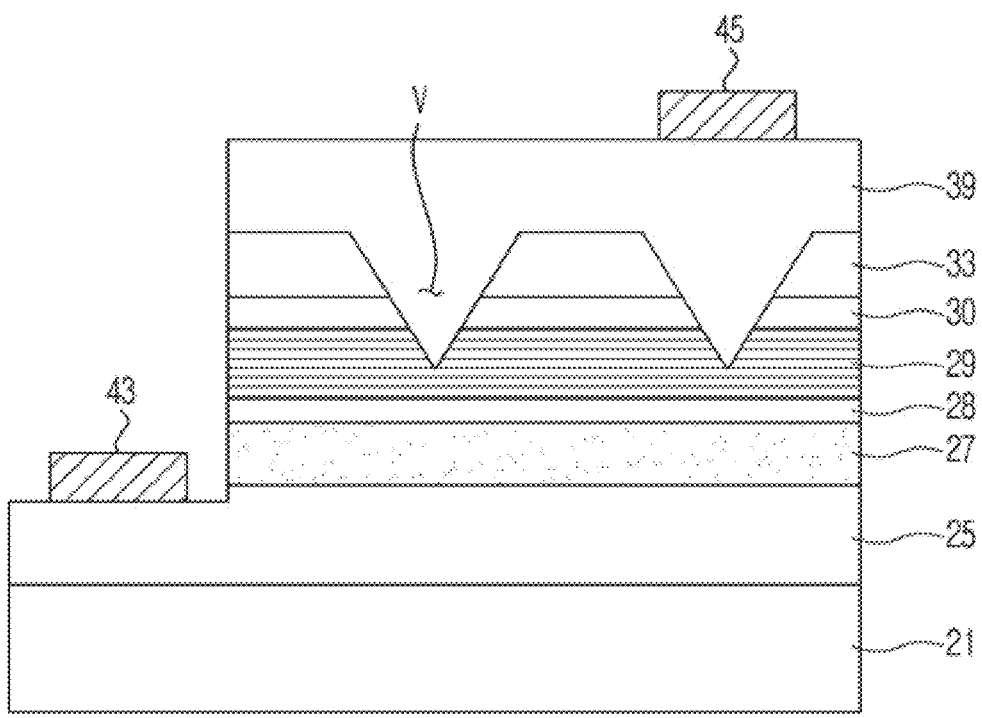
FIG. 2 is a sectional view of an exemplary semiconductor device according to a second embodiment of the disclosed technology.

FIG. 2 is a sectional view of a semiconductor device according to a second embodiment of the disclosed technology. FIG. 2 shows an example of a light emitting diode provided using the nitride semiconductor device of FIG. 1. However, it should be understood that the disclosed technology can be applied to other devices as well and is not limited to FIG. 2.

Referring to FIG. 2, a nitride semiconductor device (i.e., a light emitting diode in FIG. 2) according to the second embodiment of the invention can include a first conductive type semiconductor layer, an active layer 33, and a second conductive type semiconductor layer. In one implementation, the nitride semiconductor device can further include a substrate 21, a first electrode 43, and a second electrode 45.

Detailed descriptions of components of the nitride semiconductor device shown in FIG. 2, which are substantially the same as those described with reference to FIG. 1, are omitted and the following descriptions are limited to any differences between FIGS. 1 and 2.

The nitride semiconductor device shown in FIG. 2 can have an exposed region of an n-type nitride semiconductor layer 25 formed by partially removing the first conductive type semiconductor layer, the active layer 33, and the second conductive type semiconductor layer. Partially removing the various layers as described above can be performed through a suitable etching technique including mesa-etching.

The first electrode 43 can be disposed on the exposed region of the n-type nitride semiconductor layer 25. The first electrode 43 can electrically connect the n-type nitride semiconductor layer 25 to an external power source. The second electrode 45 can be disposed on a p-type nitride semiconductor layer 39 which is or included in the second conductive type semiconductor layer and can electrically connect the p-type nitride semiconductor layer 39 to the external power source.

According to the second embodiment of the disclosed technology, a V-pit (V) structure can be applied to the nitride semiconductor device such as a light emitting diode, thereby preventing damage to the nitride semiconductor device caused by electrostatic discharge. Therefore, it is possible to enhance reliability of the nitride semiconductor device and prevent damage caused by electrostatic discharge without using Zener diodes, thus achieving compactness and high efficiency of the nitride semiconductor device.

FIGS. 3 through 6 are sectional views showing a method of manufacturing the semiconductor device according to the second embodiment of the disclosed technology. Hereinafter, already presented descriptions of components having the same reference numerals as those described with reference to FIG. 1 or 2 will be omitted or briefly summarized, and the following description will mainly focus on any differences between any of FIGS. 1 through 6.

Figure 3:
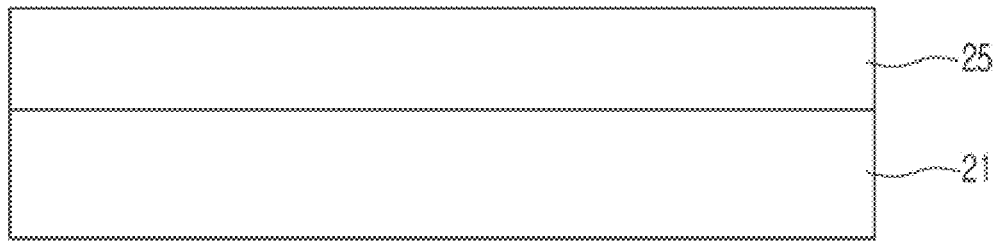
FIGS. 3 to 6 are sectional views showing a method of manufacturing the semiconductor device according to the second embodiment of the disclosed technology.

Referring to FIG. 3, an n-type nitride semiconductor layer 25 is formed on or over a substrate 21. The substrate 21 can be a substrate on which a semiconductor layer can be grown, for example, a sapphire substrate.

The n-type nitride semiconductor layer 25 can include a nitride semiconductor such as (Al, Ga, or In)N. The n-type nitride semiconductor layer 25 can include an n-type GaN layer doped with an impurity such as Si to form an n-type layer. The n-type nitride semiconductor layer 25 can be grown on the substrate 21 using metal organic chemical vapor deposition (MOCVD), molecular beam epitaxy (MBE), or hydride vapor phase epitaxy (HVPE). The n-type nitride semiconductor layer 25 can be grown at a high temperature of, for example, 1000° C. or more.

In one implementation, a buffer layer can be further formed on or over the substrate 21 before the formation of the n-type nitride semiconductor layer 25. The buffer layer can be grown at a low temperature of, for example 400° C. to 600° C.

Figure 4:
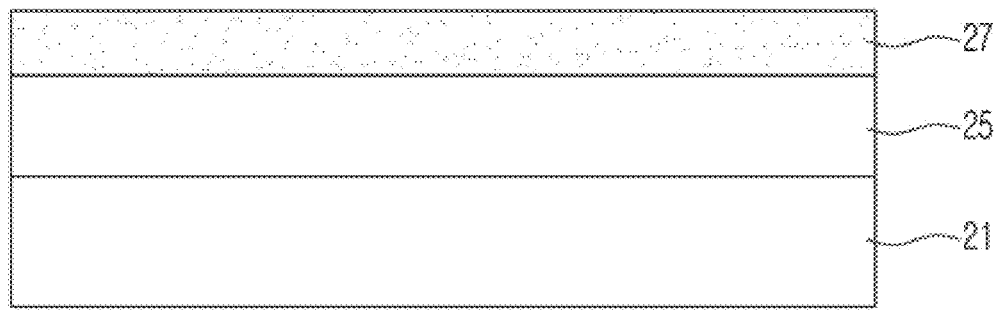
Figure 5:
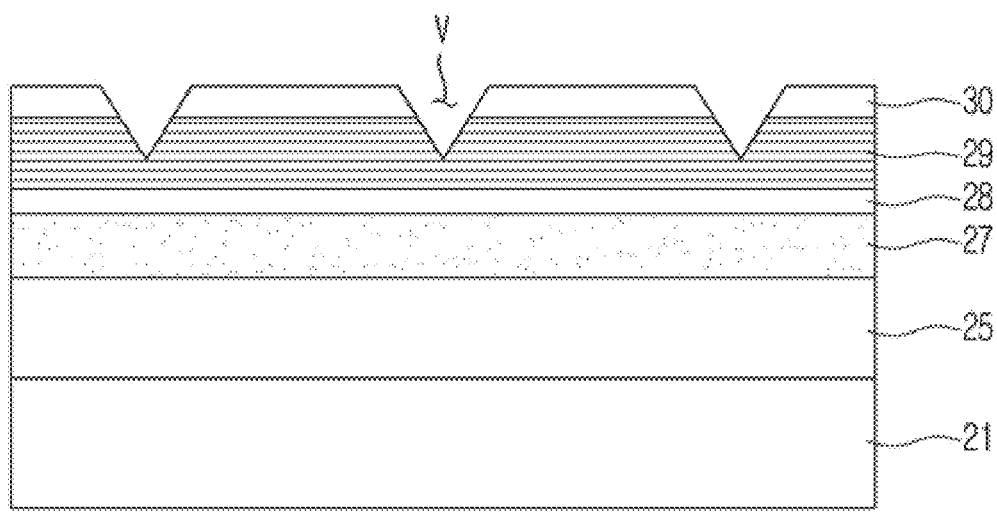

Next, referring to FIGS. 4 and 5, a conductive type semiconductor layer is formed on or over the n-type nitride semiconductor layer 25. A first upper conductive type semiconductor layer is formed, and then V-pits are formed to at least partially pass through the first upper conductive type semiconductor layer.

Referring to FIG. 4, a low-temperature growth layer 27 is grown on the n-type nitride semiconductor layer 25 at a lower temperature than the n-type nitride semiconductor layer 25 using MOCVD, MBE, or HVPE. The low-temperature growth layer 27 can include a gallium nitride semiconductor and can be undoped. For example, the low-temperature growth layer 27 can be formed by growing an undoped GaN layer at a temperature of 800° C. to 900° C. using MOCVD. The low-temperature growth layer 27 can be grown on three-dimensional and therefore can have an uneven surface.

In one implementation, the forming of the first upper conductive type semiconductor layer can further include heat treating the low-temperature growth layer 27 after the formation of the first upper conductive type semiconductor layer. The low-temperature growth layer 27 can be heat treated at a growth temperature or higher temperature than the growth temperature using an ambient gas including hydrogen. Accordingly, a defect-concentrated region on a surface of the low-temperature growth layer 27 can be selectively subjected to etching during the heat treatment, and therefore the V-pits V can be more easily formed.

The low-temperature growth layer 27 can be grown on three-dimensional at a lower temperature than that for the n-type nitride semiconductor layer 25 and thus, can provide starting points or seeds where the V-pits are to be formed. For example, due to a higher density and domination of the three-dimensional growth, the low-temperature growth layer 27 can provide starting points or seeds of the V-pits V. As described above, the V-pits V can be formed to have a greater size and a higher density than those in the conventional arts by forming the low-temperature growth layer 27 on a lower side of the first upper conductive type semiconductor layer. In addition, the low-temperature growth layer 27 can be provided with starting points or seeds of the V-pits V, and separate etching is not required to form the V-pits V. Therefore, the process of manufacturing the nitride semiconductor device can be performed in-situ, thereby enhancing process efficiency.

Referring to FIG. 5, a super-lattice layer 29 can be formed on or above the low-temperature growth layer 27. In addition, a low-temperature growth doping layer 28 can be interposed between the low-temperature growth layer 27 and the super-lattice layer 29, and a low-concentration doping layer 30 can be further formed on or above the superlattice layer 29.

The super-lattice layer 29 can be grown at a low temperature of, for example, 800° C. to 900° C., which is lower than that for the n-type nitride semiconductor layer 25 and can be formed by stacking or repetitively stacking at least two of a GaN layer, an InGaN layer, an AlGaN layer, or an AlInGaN layer. As the super-lattice layer 29 is grown, the V-pits V can also be grown to have a gradually increasing width.

The low-temperature growth doping layer 28 and the low-concentration doping layer 30 can be grown at a low temperature using MOCVD. The low-temperature growth doping layer 28 and the low-concentration doping layer 30 can be doped with an n-type impurity and can include, for example, an n-type GaN layer.

Figure 6:
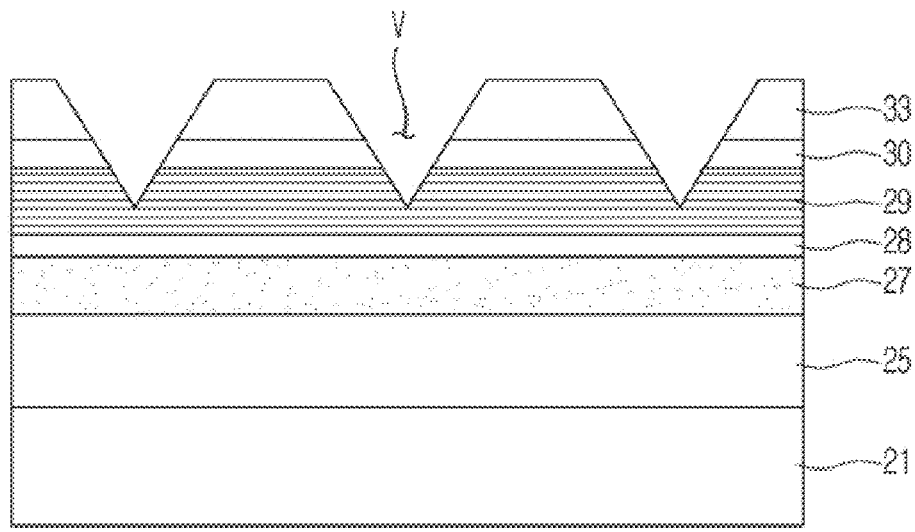

Referring to FIG. 6, an active layer 33 can be formed on or above the first upper conductive type semiconductor layer. The active layer 33 can contain indium (In) and can be grown at a lower temperature than that for the first upper conductive type semiconductor layer. The active layer 33 can be grown from a surface of the first upper conductive type semiconductor layer, for example, from a surface except for regions where the V-pits V are formed. As shown in FIG. 6, as the active layer 33 is grown, the V-pits V can extend in a growth direction of the active layer 33 and pass through the active layer 33.

A p-type nitride semiconductor layer 39, which is or included in the second conductive type semiconductor layer, can be formed on or above the active layer 33 to fill the V-pits V, thereby providing the nitride semiconductor device shown in FIG. 1.

The p-type nitride semiconductor layer 39 can be grown at a high temperature using MOCVD. The p-type nitride semiconductor layer 39 can be grown at a temperature at which a surface of the p-type nitride semiconductor layer 39 is flattened, while filling the V-pits V.

Figure 7:
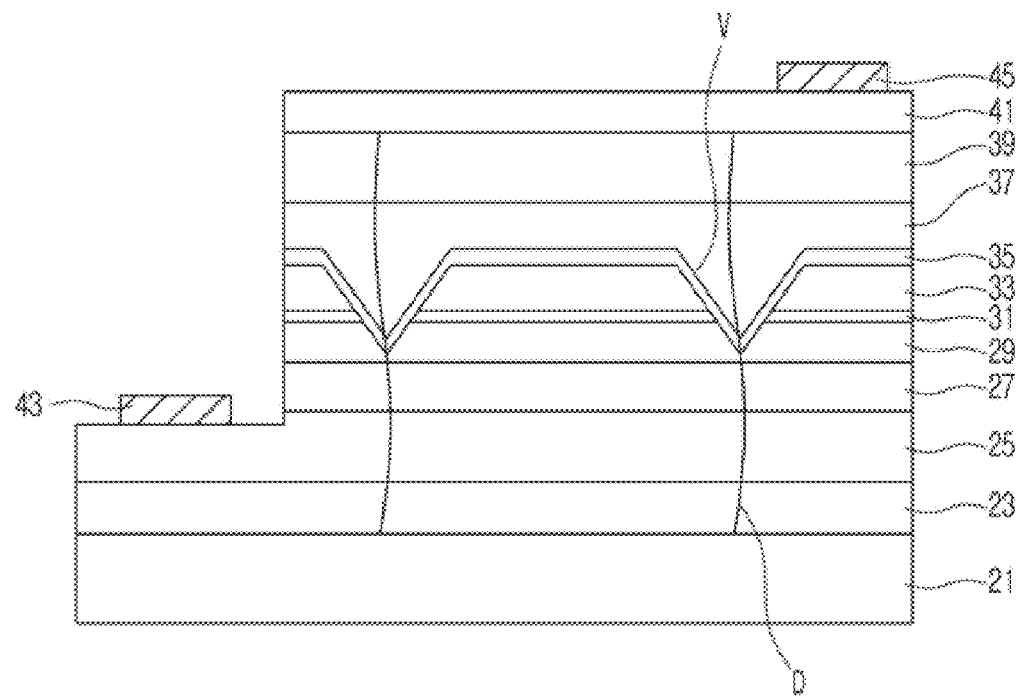
FIG. 7 is a sectional view of an exemplary semiconductor device according to a third embodiment of the disclosed technology.
Figure 8:
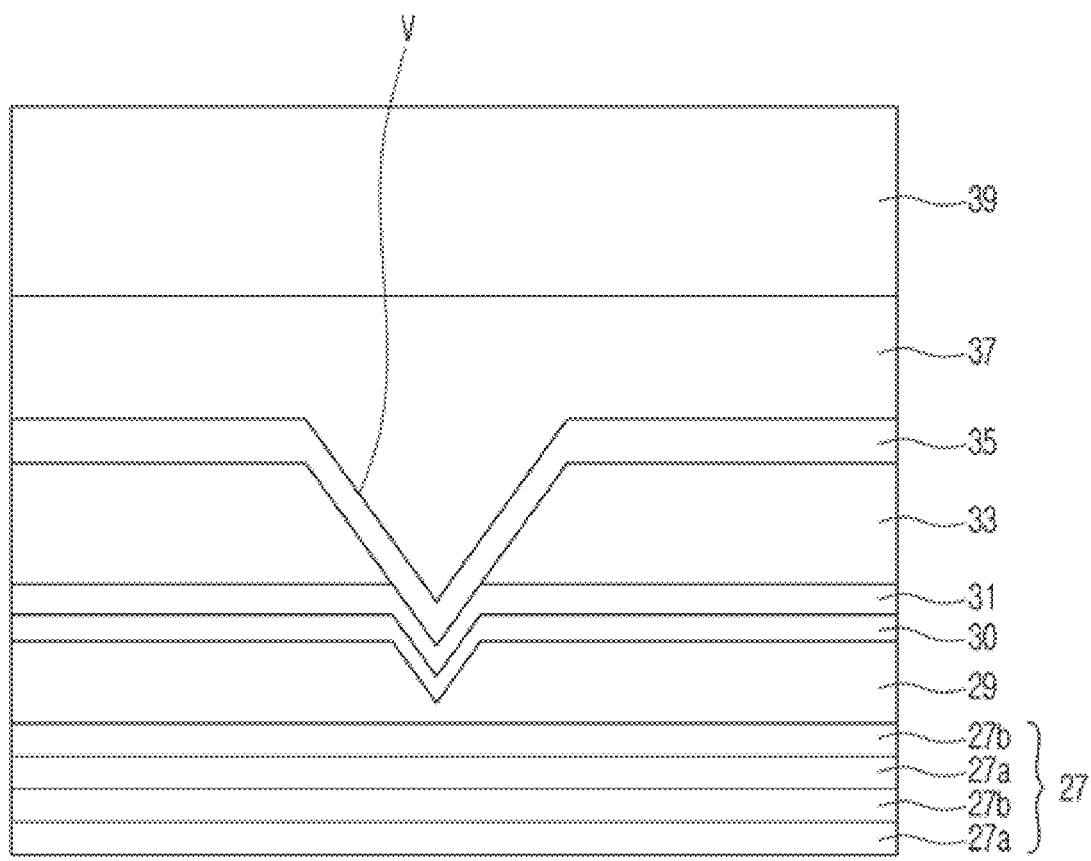
FIG. 8 is a partial sectional view of the semiconductor device of FIG. 7.
Figure 9:
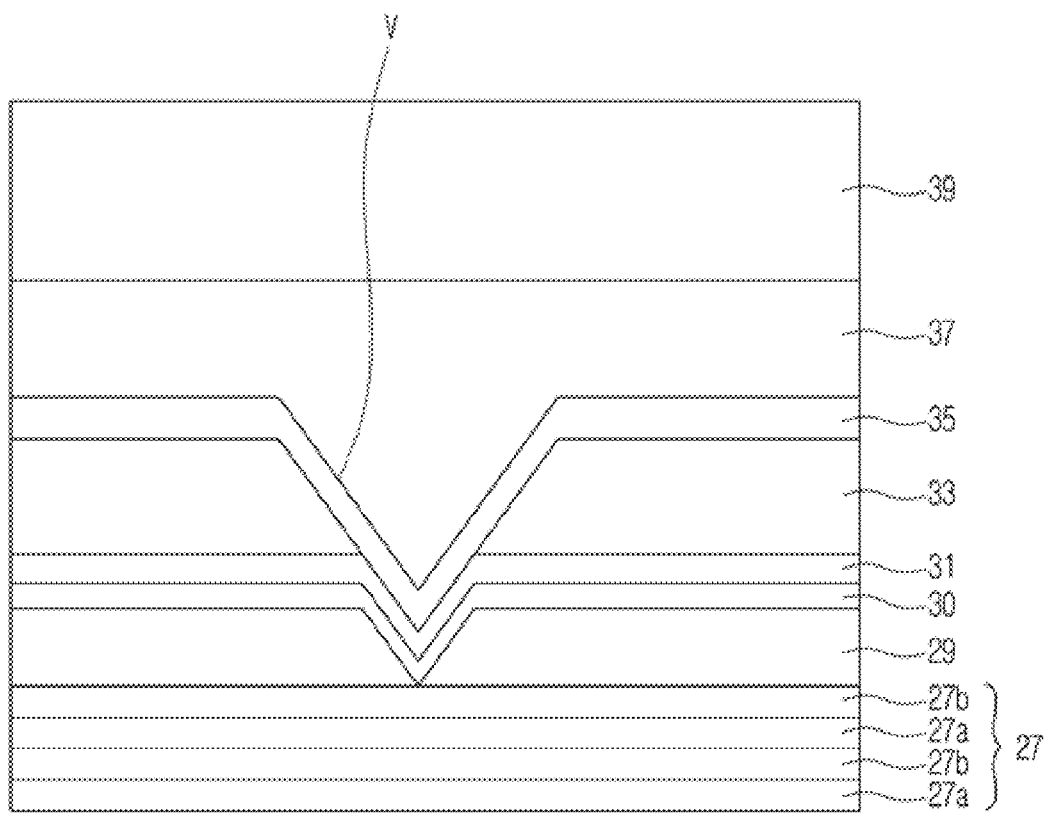
FIG. 9 is a partial sectional view of one modified example of the semiconductor device according to the third embodiment of the disclosed technology.
Figure 10:
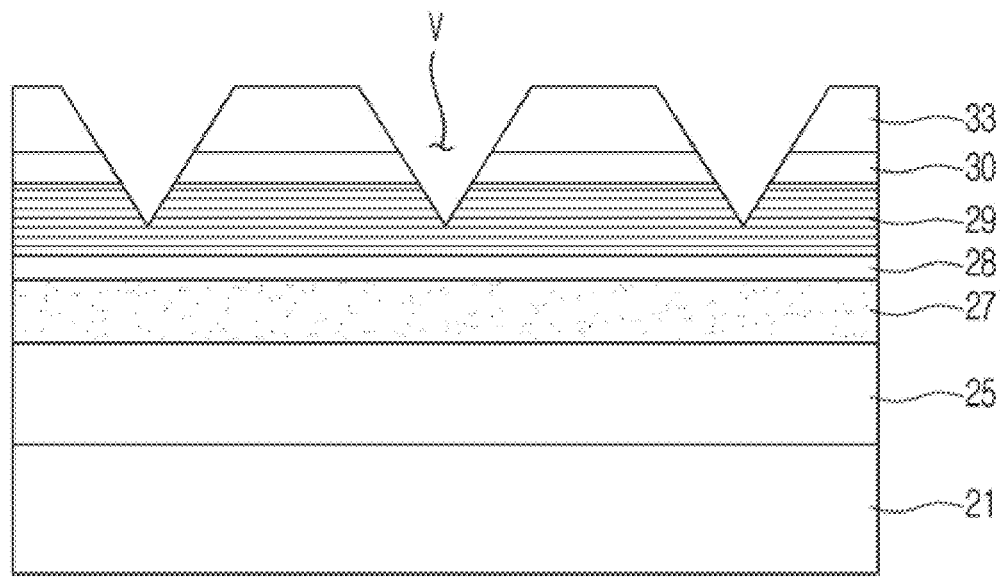
FIG. 10 is a partial sectional view of another modified example of the semiconductor device according to the third embodiment of the disclosed technology.

FIG. 7 is a sectional view of a nitride semiconductor device according to a third embodiment of the disclosed technology, and FIG. 8 is a partial sectional view of the nitride semiconductor device of FIG. 7. FIGS. 9 and 10 are partial sectional views of modified examples of the nitride semiconductor device according to the third embodiment of the disclosed technology. In the embodiments of the disclosed technology, a nitride light emitting diode will be described as an example of the nitride semiconductor device.

Referring to FIG. 7, a nitride semiconductor device includes a substrate 21, an n-type nitride semiconductor layer 25, a low-temperature growth layer 27, a super-lattice layer 29, an active layer 33, an electron blocking layer 35, a high-resistance filling layer 37, and a p-type nitride semiconductor layer 39.

The substrate 21 is used to grow a gallium nitride semiconductor layer and can be or include a sapphire substrate, a SiC substrate, a Si substrate, a spinel substrate, or the like. In one implementation, a buffer layer 23 can be grown to enhance crystal quality of a nitride semiconductor single crystal grown on the substrate 21.

The buffer layer 23 usually includes a low-temperature buffer layer and a high-temperature buffer layer. The low-temperature buffer layer can be formed of or include (Al or Ga)N on the substrate 21 at a low temperature of 400° C. to 600° C. The low-temperature buffer layer can have a thickness of, for example, about 25 nm. The high-temperature buffer layer can be grown at a higher temperature than the low-temperature buffer layer to relieve defects, such as dislocations, between the substrate 21 and the n-type nitride semiconductor layer 25. The high-temperature buffer layer can be formed of or include undoped GaN or n-type impurity doped GaN. In this case, threading dislocations D are generated between the substrate 21 and the buffer layer 23 due to lattice mismatch while the buffer layer 23 is being formed.

The n-type nitride semiconductor layer 25 can be or include a nitride semiconductor layer doped with an n-type impurity and can be formed of or include, for example, a Si-doped nitride semiconductor layer. The concentration of Si doped in the n-type nitride semiconductor layer 25 can be, for example, from $5E17/cm^2$ to $5E10/cm^2$. The n-type nitride semiconductor layer 25 can be grown at a temperature of 1000° C. to 1200° C. (e.g., 1050° C. to 1100° C.) and a growth pressure of 150 Torr to 200 Torr by supplying a metal source gas to a chamber using MOCVD. In this case, the n-type nitride semiconductor layer 25 can be continuously formed on or over the buffer layer 23, and the threading dislocations D formed in the buffer layer 23 can be transferred to the n-type nitride semiconductor layer 25.

The low-temperature growth layer 27 is placed on or above the n-type nitride semiconductor layer 25. In the third embodiment of the disclosed technology, the low-temperature growth layer 27 can be formed in a structure in which one or more AlInGaN layers 27a and AlGaN layers 27b are alternately stacked one above another. In this case, the greater number of stacks the low-temperature growth layer 27 has, the better performance the nitride semiconductor device achieves. In one implementation, the AlInGaN layers and the AlGaN layers are stacked to a level at which luminance intensity of the nitride light emitting diode does not decrease.

The low-temperature growth layer 27 can also be formed of or include a super-lattice layer in which an InGaN layer and a GaN layer are alternately stacked. In this case, the low-temperature growth layer 27 formed of or including the super-lattice layer including the InGaN layer and the GaN layer can be used for electrostatic discharge. The doping concentration of indium (In) can be, for example, 4.7% based on XRF CAL.

The size of the V-pits V can be regulated by adjusting a stacking cycle of the low-temperature growth layer 27. The InGaN layer can have a thickness of about 2 nm, and the GaN layer can have a thickness of about 6 nm. The low-temperature growth layer 27 can be formed by stacking the super-lattice layer in three cycles. The V-pits V can become smaller by decreasing a super-lattice cycle of the low-temperature growth layer 27 and become greater by increasing the super-lattice cycle of the low-temperature growth layer 27.

The low-temperature growth layer 27 can be grown at a lower temperature than the n-type nitride semiconductor layer 25. In the third embodiment of the disclosed technology, the low-temperature growth layer 27 can be grown at a temperature of about 900° C. When grown, the low-temperature growth layer 27 can act as a seed of the V-pits V by artificially deteriorating crystal quality and accelerating three-dimensional growth, thus artificially increasing the size of the V-pits V formed in the active layer 33.

In order to more efficiently increase the size of the V-pits V, a lattice constant of the low-temperature growth layer 27 can be adjusted to be greater than that of the n-type nitride semiconductor layer 25. For example, the low-temperature growth layer 27 can contain indium (In). That is why the AlInGaN layer 27a is included in the low-temperature growth layer 27 as described above. When the low-temperature growth layer 27 contains indium (In), there is a difference in lattice constant between the low-temperature growth layer 27 and the n-type nitride semiconductor layer 25 and stacking faults of the threading dislocations D are radiated in a V-pit shape at a faster speed, whereby the V-pits have a clear interface and become greater. In one implementation, InGaN or InAlN can be used instead of AlInGaN.

The active layer 33 is placed on or above the low-temperature growth layer 27, and the super-lattice layer 29 can be formed between the low-temperature growth layer 27 and the active layer 33 in the third embodiment of the disclosed technology. The super-lattice layer 29 can be formed of or include InGaN/InGaN. Spread of the V-pits is accelerated due to a difference between an average lattice constant of the super-lattice layer 29 and lattice constant of the low-temperature growth layer 27 or the n-type nitride semiconductor layer 25.

For example, the low-temperature growth layer 27 can have the smallest lattice constant, the super-lattice layer 29 can have an intermediate average lattice constant, and the active layer 33 can have the largest lattice constant. Accordingly, compressive strain is consistently applied to the V-pits V, thereby causing enlargement of the V-pits. In another example, the low-temperature growth layer 27 can have the smallest lattice constant, the super-lattice layer 29 can have the largest average lattice constant, and the lattice constant of the active layer 33 can have an intermediate lattice constant. Since the enlargement of the V-pits V is proportional to a difference in average lattice constant between the super-lattice layer 29 and the low-temperature growth layer 27 and the thickness of the super-lattice layer 29, the V-pits V can be further expanded. However, when there is a large difference in lattice constant between the super-lattice layer 29 and the active layer 33, a piezoelectric field can increase in an inner quantum well layer of the active layer 33 and inner quantum efficiency of the active layer 33 can be lowered due to a quantum confined stark effect. Therefore, the super-lattice layer 29 is required to have a proper thickness and composition ratio. In the third embodiment of the disclosed technology, the super-lattice layer 29 can have an average thickness of about 70 nm to 100 nm and can be or include an InGaN layer having an In ratio of, for example, 5% to 10%. A well layer in the active layer 33 can be or include an InGaN layer having an In ratio of, for example, 10% to 20%. The low-temperature growth layer 27 can have an In ratio of 5% or less. When an upper layer has a higher In ratio than a lower layer, compressive strain is applied to the upper layer and therefore, the V-pits V can gradually spread.

The active layer 33 emits light through recombination of electrons and holes. The active layer 33 can have a single quantum well structure or a multi-quantum well (MQW) structure in which a quantum barrier layer and a quantum well layer are alternately stacked one above another. The quantum barrier layer can be formed of or include a nitride semiconductor layer, such as GaN, InGaN, AlGaN, or AlInGaN, having a wider band gap than the quantum well layer. In the third embodiment, the quantum barrier layer can be formed of or include AlInGaN so as to enhance recombination efficiency of carriers.

The quantum well layer can be formed of or include a nitride semiconductor layer, for example, a gallium nitride semiconductor layer such as InGaN, having a narrower band gap than the quantum barrier layer. A composition ratio can be determined by a desired light wavelength to control a band gap. In one implementation, the active layer 33 can contact the low-temperature growth layer 27. Alternatively, as described in the present embodiment, the super-lattice layer 29 can be interposed between the active layer 33 and the low-temperature growth layer 27. Alternatively, a current spreading layer (not shown) can be interposed between the active layer 33 and the low-temperature growth layer 27.

Although the quantum barrier layer and the quantum well layer of the active layer 33 can be formed of or include an undoped layer, which is not doped with impurities, so as to enhance crystal quality of the active layer 33, any portion including the entirety of the active layer can be doped with impurities so as to reduce forward voltage.

When the quantum barrier layer of the active layer 33 is formed of or include AlInGaN as described above, the V-pits V can be formed on or over an upper surface of the active layer 33, with the threading dislocations D at the center of the active layer 33. The V-pits V can be formed in the shape of an inverted polygonal (e.g., hexagonal) pyramid and become larger depending upon the location of the low-temperature growth layer 27 and a composition ratio and thickness of the super-lattice layer 29. The V-pits V can be consistently formed along with the growth of the super-lattice layer 29 and the active layer 33 under influence of strain caused by a difference in lattice constant between the super-lattice layer 29 formed of or include InGaN/InGaN and the active layer 33 formed of or include AlInGaN. The V-pits V can be made larger under influence of the low-temperature growth layer 27.

The V-pits V can be formed in the active layer 33 even though the low-temperature growth layer 27 is not interposed between the n-type nitride semiconductor layer 25 and the super-lattice layer 29. However, in this case, the V-pits V can have a size of, for example, 100 nm or less. In contrast, when the low-temperature growth layer 27 is interposed between the n-type nitride semiconductor layer 25 and the super-lattice layer 29, and an In content contained in the low-temperature growth layer 27 is controlled as in the third embodiment of the disclosed technology, the V-pits V can have a size of, for example, 100 nm to 200 nm. In addition, a clear interface can be obtained. Here, the size of the V-pits V means the maximum width of the V-pits.

The V-pits V can be formed in the super-lattice layer 29 and the active layer 33. In some cases, the V-pits V can be formed to an upper end of the low-temperature growth layer 27.

In the third embodiment, a high-concentration barrier layer 31 doped with high-concentration Si can be placed at a starting point where the active layer 33 is grown. The high-concentration barrier layer 31 can be grown fast to obtain higher Si doping and doped with Si of, for example, $1E19/cm^2$ to $5E19/cm^2$. The high-concentration barrier layer 31 can include In or Al to increase horizontal spreading of electrons. In this case, the high-concentration barrier layer 31 is formed to a thickness of 10 nm or more in consideration of a horizontal spreading effect of electrons. A low-concentration doping layer 30 can be interposed between the high-concentration barrier layer 31 and the n-type nitride semiconductor layer 25. The super-lattice layer 29 interposed between the high-concentration barrier layer 31 and the n-type nitride semiconductor layer 25 can be doped to a low concentration. In this way, the low-concentration layers are formed between the high-concentration layers, which results in operating as a capacitor, thereby enhancing electrostatic discharge characteristics. In this case, a doping concentration of the super-lattice layer 29 can be equal to or lower than that of the low-concentration doping layer 30.

Although not shown in FIGS. 7 and 8, the high-concentration barrier layer 31 can be interposed between the low-concentration doping layer 30 and the super-lattice layer 29 doped to a low concentration and between the active layer 33 and the super-lattice layer 29 doped to a low concentration to form a plurality of inner capacitors in series. In this way, the capacitors are connected in series by forming the low-concentration layers between the high-concentration layers, thereby facilitating injection of electrons into the active layer 33 and increasing capacitance in application of forward voltage.

The V-pits V can start from the low-temperature growth layer 27 and then cross the high-temperature barrier layer 31, the low-concentration doping layer 30, and the active layer 33. Therefore, unlike having no V-pits or having small V-pits, the high-concentration barrier layer 31 is formed in a three-dimensional shape having V-pits, not a 2D layer structure. As the V-pits V are enlarged due to the high-concentration barrier layer 31 formed in a three-dimensional shape as described above, a horizontal area of the high-concentration barrier layer 31 is also increased, thereby increasing capacity of the capacitors and enhancing electrostatic discharge characteristics.

If the high-concentration barrier layer 31 doped with high-concentration Si is formed without the low-temperature growth layer 27, the V-pits V can have a very low density and a small size. However, even in this case, electrostatic discharge characteristics can be improved. The low-temperature growth layer 27 is formed to enlarge the V-pits V and the high-concentration barrier layer 31 is formed to effectively block current leakage through the threading dislocations D during electrostatic discharge, thereby further enhancing electrostatic discharge characteristics.

Annealing can be performed after the low-temperature growth layer 27 is grown. The annealing can be performed by increasing a temperature to 1050° C. and decreasing the temperature after the growth of the low-temperature growth layer 27. When annealing is performed, starting points of V-pits V are formed over the low-temperature growth layer 27, as shown in FIG. 8. In contrast, when annealing is omitted, starting points of V-pits V are formed on or over the low-temperature growth layer 27, as shown in a modified example of the third embodiment shown in FIG. 9. Therefore, the size of the V-pits V can be finely controlled by adjusting a maximum temperature of annealing and a temperature lowering time, as compared with when the V-pits V are controlled using a composition ratio or thickness of the super-lattice layer 29.

As shown in FIG. 10, the V-pits V can be formed at starting points of the Vi-pits V on the low-temperature growth layer 27. In this case, the V-pits V can have a uniform size due to the low-temperature growth layer 27, as shown in FIG. 10.

Annealing for controlling the size of the V-pits V can be added or omitted.

Although the high-resistance filling layer 37 can be formed directly on the active layer 33, the electron blocking layer (EBL) 35 is interposed between the active layer 33 and the high-resistance filling layer 37 in the third embodiment of the disclosed technology. The electron blocking layer 35 can be formed of or include AlGaN or AlInGaN. For example, the electron blocking layer 35 can be formed of or include AlInGaN to relieve lattice mismatch with the active layer 33. The electron blocking layer 35 can contain about 25% Al. Although the electron blocking layer 35 can be doped with a p-type impurity such as Mg, the electron blocking layer 35 cannot be intentionally doped with an impurity. In the third embodiment of the disclosed technology, the electron blocking layer 35 can have a thickness of about 20 nm to 25 nm.

The electron blocking layer 35 is placed on or above the active layer 33 and fills some portions of the V-pits formed in the active layer 33 and the super-lattice layer 29. That is, the electron blocking layer 35 covers an upper surface of the active layer 33 and a surface of the V-pits V. Since the electron blocking layer 35 does not have a thickness capable of completely filling the V-pits V in the active layer 33 and the super-lattice layer 29, the electron blocking layer 35 fills only some portions of the V-pits V.

The high-resistance filling layer 37 is placed on or over the electron blocking layer 35. The high-resistance filling layer 37 completely fills the entirety of the V-pits V, which are not filled by the electron blocking layer 35. The high-resistance filling layer 37 can prevent the threading dislocations D from acting as a current leakage path, thereby enhancing electrostatic discharge characteristics of the nitride light emitting diode.

Since the V-pits V are filled with the high-resistance filling layer 37 instead of the p-type nitride semiconductor layer 39, resistivity of internal regions of the V-pits V is higher than that of the p-type nitride semiconductor layer.

The high-resistance filling layer 37 can be formed of or include AlGaN containing Al. Resistivity of the internal regions of the V-pits V can be further decreased by filling the V-pits V with the high-resistance filling layer 37 including Al, thus preventing the threading dislocations D from acting as the current leakage path.

The p-type nitride semiconductor layer 39 can be formed of or include a semiconductor layer doped with a p-type impurity such as Mg. The p-type nitride semiconductor layer 39 can be a single layer or multiple layers and can include a p-type clad layer and a p-type contact layer. A transparent electrode 41 such as indium tin oxide (ITO) can be placed on or above the p-type nitride semiconductor layer 39. An electrode can be formed on or over an exposed region of the n-type nitride semiconductor layer 25 formed by partially removing the p-type nitride semiconductor layer 39, the high-resistance filling layer 37, the active layer 33, and the low-temperature growth layer 27. A first electrode 43 is formed on or over the n-type nitride semiconductor layer 25 and a second electrode 45 is formed on or over the transparent electrode 41 formed on or over the p-type nitride semiconductor layer 39, thereby providing the light emitting diode.

Figure 11:
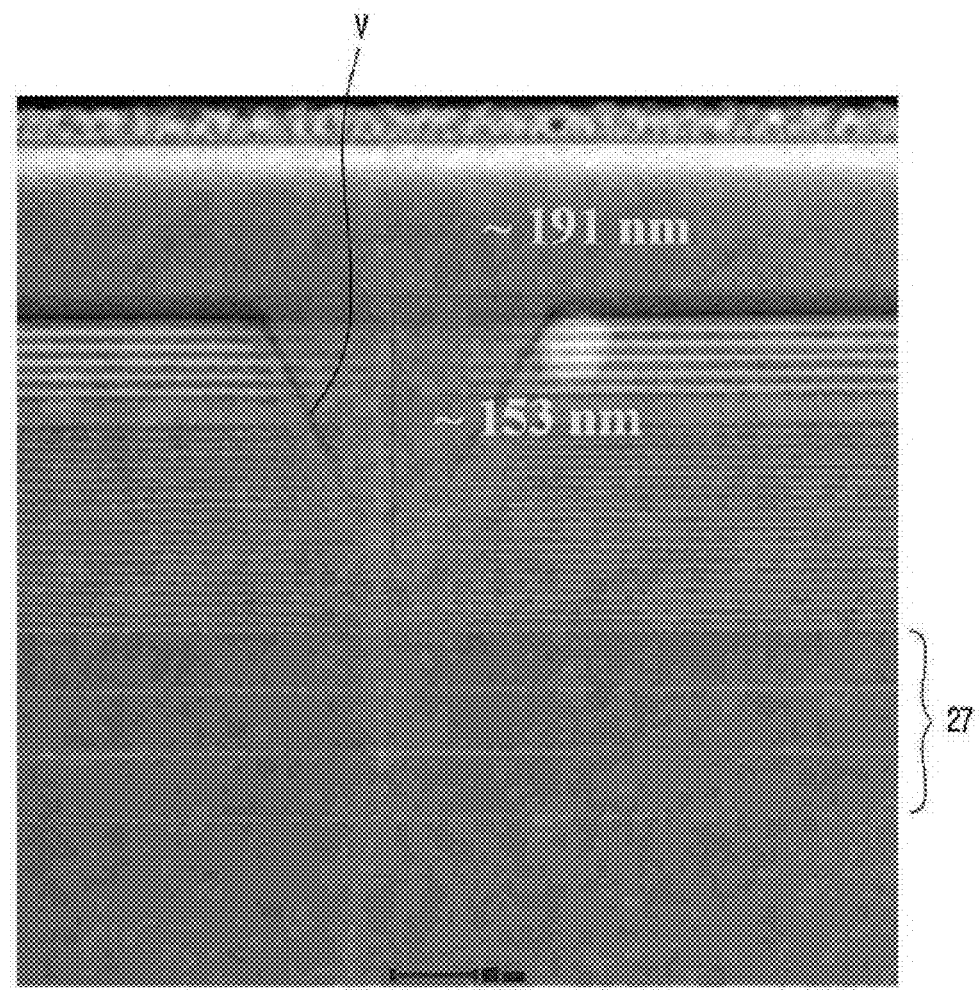
FIG. 11 is an exemplary TEM image of the nitride semiconductor device according to the third embodiment of the disclosed technology.
Figure 12:
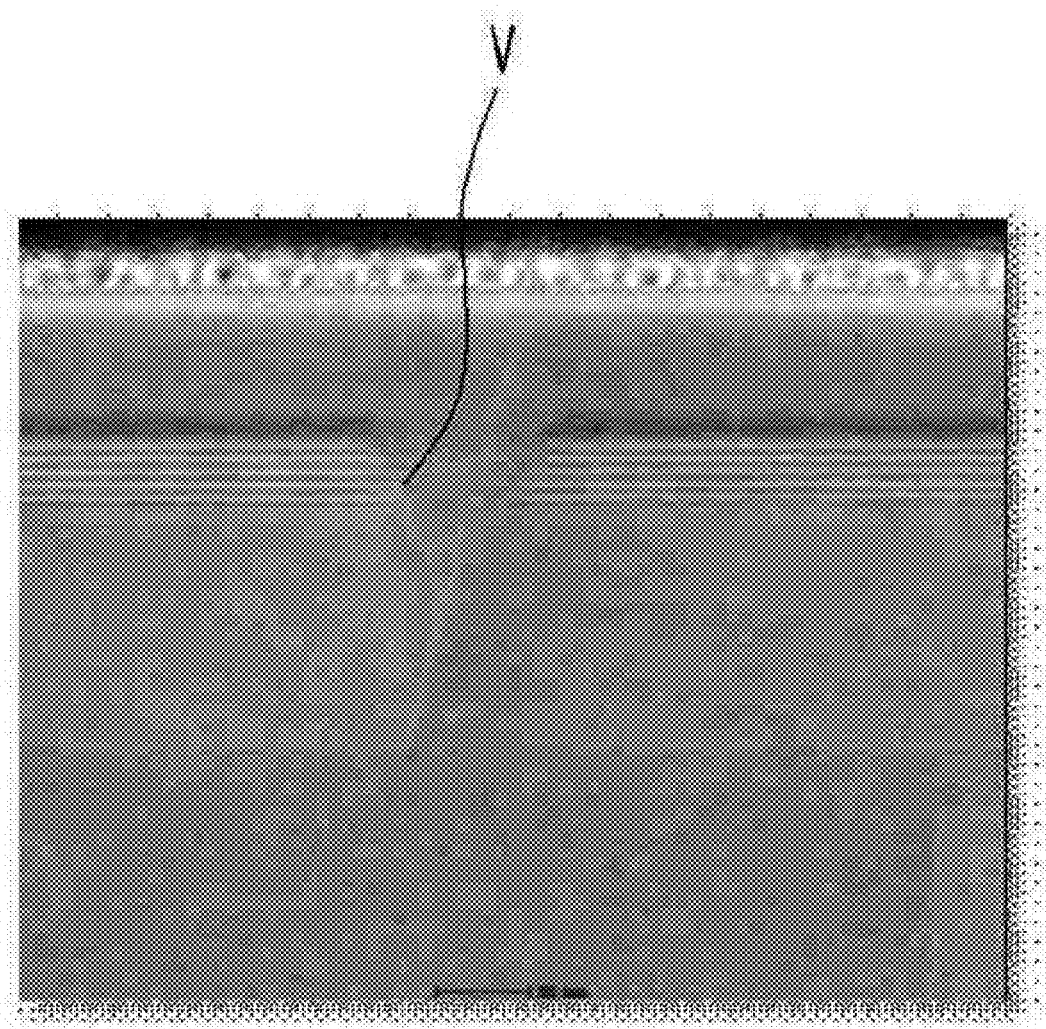
FIG. 12 is a TEM image of a conventional nitride semiconductor device that is shown for the purpose of a comparison with the TEM image of FIG. 11.

FIG. 11 is a TEM image of the nitride semiconductor device provided according to the third embodiment of the disclosed technology, and FIG. 12 is a TEM image of a conventional nitride semiconductor device that is shown for the purpose of comparison with the TEM image shown in FIG. 11.

As shown in FIG. 11, a V-pit V formed in the nitride light emitting diode according to the third embodiment of the disclosed technology has a maximum width of about 191 nm and a depth of about 153 nm. FIG. 12 shows a V-pit V formed in a nitride light emitting diode that does not include the low-temperature growth layer 27. It can be confirmed that the V-pit V formed in the nitride light emitting diode including the low-temperature growth layer 27 as disclosed in this patent document is larger than that of the nitride light emitting diode not including the low temperature growth layer 27.

Figure 13:
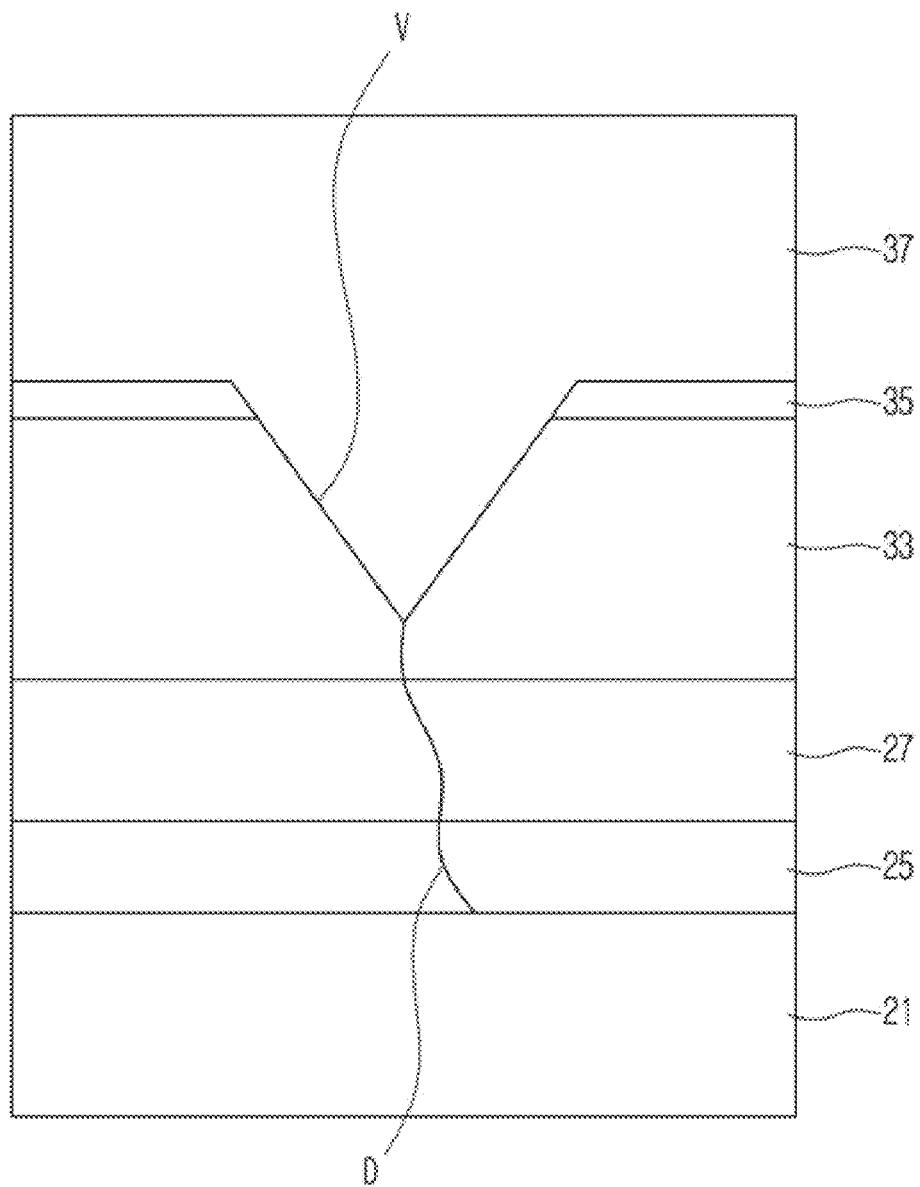
FIG. 13 is a partial sectional view of an exemplary semiconductor device according to a fourth embodiment of the disclosed technology.

FIG. 13 is a partial sectional view of a nitride semiconductor device according to a fourth embodiment of the disclosed technology.

In describing the fourth embodiment of the disclosed technology, the same components as those of the third embodiment are denoted by the same reference numerals and detailed descriptions thereof will be omitted.

In the nitride semiconductor device according to the fourth embodiment of the disclosed technology, the V-pits V are not filled with a high-resistance filling layer, and a p-type nitride semiconductor layer is changed to the high-resistance filling layer 37. Al can be added to the high-resistance filling layer 37 to increase resistance of the high-resistance filling layer 37.

A process of using the p-type nitride semiconductor layer to fill the V-pits V with the high-resistance filling layer 37 will be described in more detail hereinafter. An electron blocking layer 35 is grown before the V-pits V are filled using the p-type nitride semiconductor layer. Unlike in the third embodiment, in the fourth embodiment of the disclosed technology, the electron blocking layer 35 is not formed within the V-pits V and can be formed along the periphery of the V-pits as shown in FIG. 13. In the fourth embodiment of the disclosed technology, the electron blocking layer 35 can be formed on or over an active layer 33 along the periphery of the V-pits V.

Although the active layer 33 is shown alone in FIG. 13, a super-lattice layer 29 and a high-resistance barrier layer 31 can be formed together with the active layer 33 as in the third embodiment of the disclosed technology.

Figure 15:
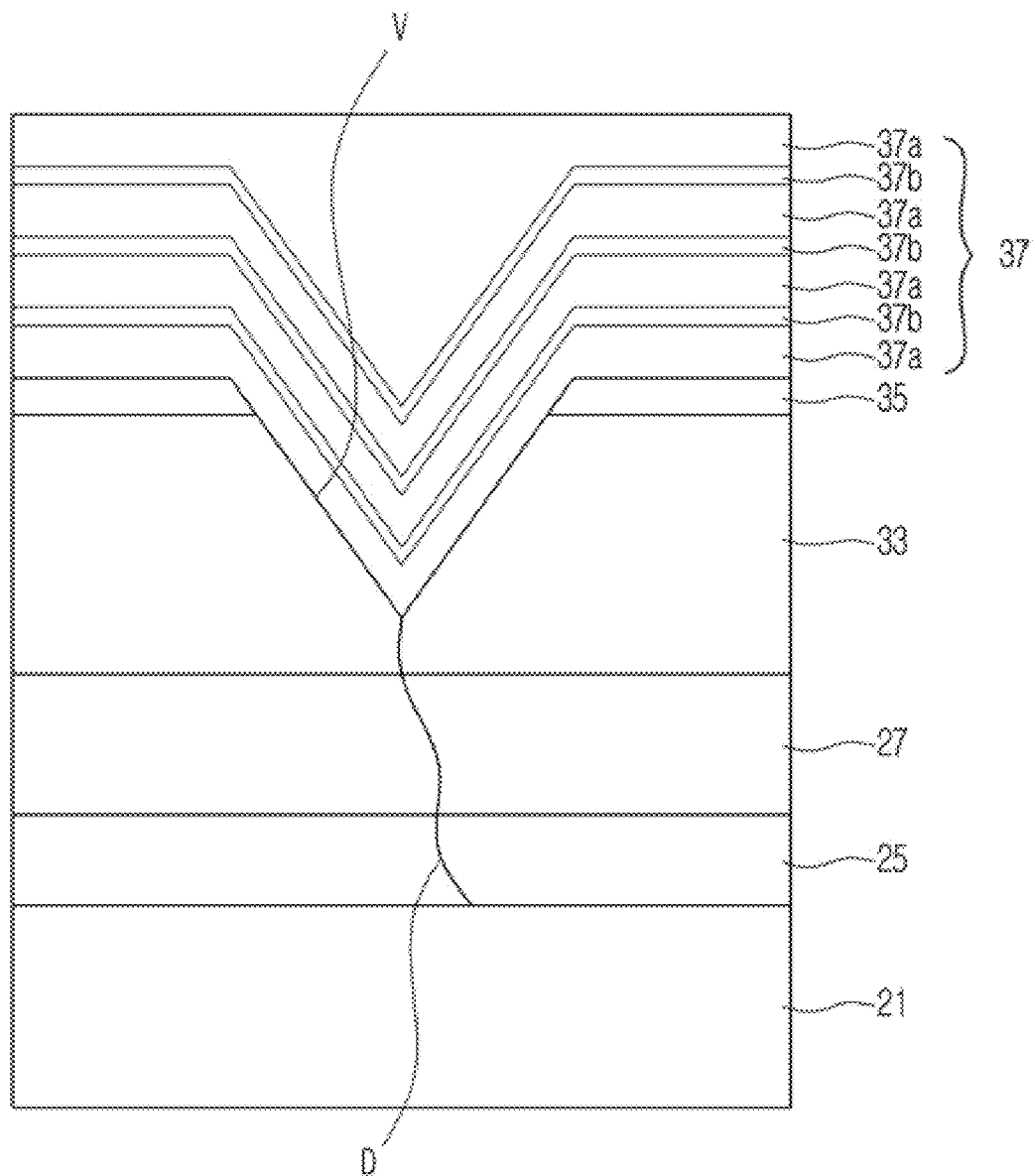
FIG. 15 is a partial sectional view showing a high-resistance filling layer within V-pits of the semiconductor device of FIG. 13.

FIG. 14 is a sequence chart showing a process of forming a high-resistance filling layer, by using u-AlGaN and a p-type nitride semiconductor layer, within V-pits of the nitride semiconductor device according to the fourth embodiment of the disclosed technology. FIG. 15 is a partial sectional view showing a high-resistance filling layer within V-pits of the nitride semiconductor device according to the fourth embodiment of the disclosed technology.

Referring to FIGS. 14 and 15, an undoped layer 37a having a thickness of, for example, 30 nm to 40 nm is grown and then, a p-type nitride semiconductor layer 37b having a thickness of, for example, 3 nm to 5 nm is grown. Thereafter, the undoped layer 37a and the p-type nitride semiconductor layer 37b that is a doping layer are sequentially grown again. In the fourth embodiment of the disclosed technology, the undoped layer 37a and the p-type nitride semiconductor layer 37b are sequentially grown in three cycles. Hole injection can be enhanced by periodically growing the undoped layer 37a and the p-type nitride semiconductor layer 37b. After the undoped layer 37a and the p-type nitride semiconductor layer 37b are sequentially grown in three cycles, the V-pits can be filled with the high-resistance filling layer 37 and flattened by forming the undoped layer 37a.

In the fourth embodiment of the disclosed technology, the V-pits V can have a density of, for example, 1E8 cm$^{-1}$ to 5E8 cm$^{-1}$ and a size of, for example, 100 nm to 200 nm. An area of the V-pits calculated using the density and the size can be 2% to 23% of the entire area, and hole injection efficiency can be enhanced corresponding to the area of the V-pits. Enhancement in terms of the hole injection efficiency can be applied not only to the high-resistance filling layer 37 but also to the high-concentration barrier layer 31.

In FIG. 14, TMGa denotes a Ga source, TMAl denotes an Al source, and Cp2Mg denotes an Mg source.

Figure 16:
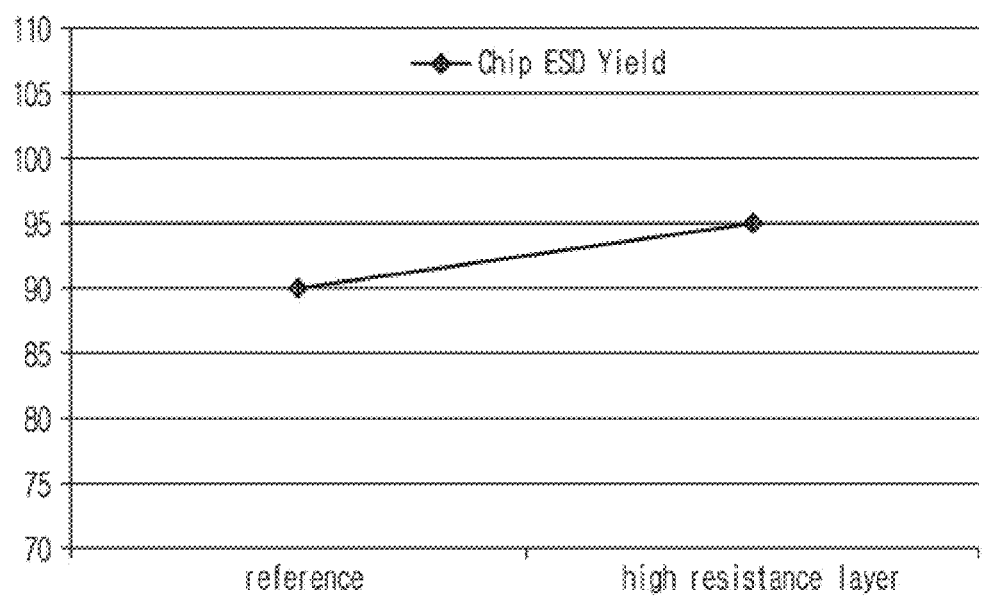
FIG. 16 is a graph showing electrostatic discharge characteristics of the semiconductor device of FIG. 13.

FIG. 16 is a graph showing electrostatic discharge characteristics of the semiconductor device according to the fourth embodiment of the disclosed technology.

In order to measure electrostatic discharge characteristics, backward and forward voltages of 3 kV were sequentially applied three times to a plurality of nitride semiconductor devices. Among the total number of nitride semiconductor devices, the number of nitride semiconductor devices, a leakage current of which is 1 μA or less at a voltage of −5 V, was defined as a yield.

According to the fourth embodiment of the disclosed technology, it can be seen that an electrostatic discharge yield is further enhanced than in the nitride semiconductor device implemented without using the disclosed technology, such as not including the low temperature growth layer 27. That is, through the fact that a defect rate of electrostatic discharge of the nitride semiconductor device implemented without using the disclosed technology, such as not including the low temperature growth layer 27 is 1% to 3%, whereas that of the nitride semiconductor device according to the fourth embodiment of the disclosed technology is 0% to 1.5%, it can be confirmed that the electrostatic discharge yield is further enhanced than previously possible without using the disclosed technology. When the nitride semiconductor device has a strong tolerance to electrostatic discharge, it is possible to prevent a light emitting diode from being damaged due to static electricity induced by machinery or people.

Although the various implementations of the disclosed technology has been specifically described with reference to the accompanying drawings, the above descriptions have been given by way of examples of the disclosed technology in this patent document. Therefore, the disclosed technology should not be construed as being limited only to the embodiments and it should be understood that the scope of the disclosed technology is defined by the following claims and equivalents thereof.

<Legend of Reference Numerals>

| | |
|---|---|
| 21: Substrate | 23: Buffer layer |
| 25: n-type nitride semiconductor layer | 27: Low-temperature growth layer |
| 28: Low-temperature growth doping layer | 29: Superlattice layer |
| 30: Low-concentration doping layer | 31: High-concentration barrier layer |
| 33: Active layer | 35: Electron block layer |
| 37: High-resistance filling layer | 39: p-type nitride semiconductor layer |
| 41: Transparent electrode | 43: First electrode |
| 45: Second electrode | |
| D: Threading dislocation | V: V-pit |

What is claimed is:

1. A semiconductor device comprising:
    a first conductive type semiconductor layer comprising a first lower conductive type semiconductor layer and a first upper conductive type semiconductor layer;
    V-pits passing through at least one portion of the first upper conductive type semiconductor layer;
    a second conductive type semiconductor layer placed over the first conductive type semiconductor and filling the V-pits; and
    an active layer interposed between the first and second conductive type semiconductor layers, the V-pits passing through the active layer,
    wherein the first upper conductive type semiconductor layer has a higher defect density than the first lower conductive type semiconductor layer and comprises a V-pit generation layer comprising starting points of the V-pits, wherein the first upper conductive type semiconductor layer further comprises a super-lattice layer placed over the V-pit generation layer, and wherein the first upper conductive type semiconductor layer further comprises a low-temperature growth doping layer interposed between the V-pit generation layer and the superlattice layer.

2. The semiconductor device according to claim 1, wherein a lattice constant of the superlattice layer is larger than that of a low-temperature growth layer.

3. The semiconductor device according to claim 2, wherein the V-pit generation layer and the superlattice layer include indium (In) and an In content of the V-pit generation layer is lower than that of the superlattice layer.

4. The semiconductor device according to claim 1, wherein the V-pit generation layer includes an undoped GaN layer.

5. A semiconductor device comprising:
a first conductive type semiconductor layer comprising a first lower conductive type semiconductor layer and a first upper conductive type semiconductor layer;
V-pits passing through at least one portion of the first upper conductive type semiconductor layer;
a second conductive type semiconductor layer placed over the first conductive type semiconductor and filling the V-pits; and
an active layer interposed between the first and second conductive type semiconductor layers, the V-pits passing through the active layer,
wherein the first upper conductive type semiconductor layer has a higher defect density than the first lower conductive type semiconductor layer and comprises a V-pit generation layer comprising starting points of the V-pits,
wherein the V-pit generation layer includes indium (In), and
wherein the V-pit generation layer includes an AlInGaN based nitride semiconductor layer and an AlGaN based nitride semiconductor layer that are alternately stacked.

6. A semiconductor device comprising:
a first conductive type semiconductor layer comprising a first lower conductive type semiconductor layer and a first upper conductive type semiconductor layer;
V-pits passing through at least one portion of the first upper conductive type semiconductor layer;
a second conductive type semiconductor layer placed over the first conductive type semiconductor and filling the V-pits;
an active layer interposed between the first and second conductive type semiconductor layers, the V-pits passing through the active layer;
a low-concentration doping layer interposed between the V-pit generation layer and the active layer; and
a high-concentration barrier layer interposed between the low-concentration doping layer and the active layer and doped with Si,
wherein the first upper conductive type semiconductor layer has a higher defect density than the first lower conductive type semiconductor layer and comprises a V-pit generation layer comprising starting points of the V-pits.

7. The semiconductor device according to claim 6, wherein a doping concentration of the low-concentration doping layer is lower than those of the high-concentration barrier layer and the first lower conductive type semiconductor layer to form a capacitor.

8. The semiconductor device according to claim 7, wherein a doping concentration of the low-concentration superlattice layer is equal to or lower than that of the low-concentration doping layer.

9. The semiconductor device according to claim 6, further comprising:
a low-concentration superlattice layer interposed between the low-concentration doping layer and the high-concentration barrier layer.

10. The semiconductor device according to claim 6, wherein the V-pits cross the high-concentration barrier layer such that the high-concentration barrier layer has a three-dimensional shape.

11. A semiconductor device comprising:
a first conductive type semiconductor layer comprising a first lower conductive type semiconductor layer and a first upper conductive type semiconductor layer;
V-pits passing through at least one portion of the first upper conductive type semiconductor layer;
a second conductive type semiconductor layer placed over the first conductive type semiconductor and filling the V-pits;
an active layer interposed between the first and second conductive type semiconductor layers, the V-pits passing through the active layer; and
a high-resistance filling layer interposed between the active layer and the second conductive type semiconductor layer and filling the V-pits,
wherein the first upper conductive type semiconductor layer has a higher defect density than the first lower conductive type semiconductor layer and comprises a V-pit generation layer comprising starting points of the V-pits.

12. The semiconductor device according to claim 11, wherein the high-resistance filling layer includes an undoped layer and a doping layer that are alternately stacked such that holes are injected into the active layer through inner inclined surfaces of the V-pits.

13. The semiconductor device according to claim 12, wherein the undoped layer includes a uAlGaN layer and the doping layer includes a p-type nitride semiconductor layer.

14. The semiconductor device according to claim 12, wherein the undoped layer includes a uGaN layer and the doping layer includes a p-type nitride semiconductor layer.

15. The semiconductor device according to claim 12, wherein the undoped layer and the doping layer are alternately repetitively stacked.

16. The semiconductor device according to claim 11, further comprising:
an electron blocking layer interposed between the active layer and the high-resistance filling layer and filling at least one portion of the V-pits,
wherein the high-resistance filling layer fills the rest of the V-pits.

* * * * *